United States Patent [19]

Hineno et al.

[11] Patent Number: 4,923,089
[45] Date of Patent: May 8, 1990

[54] PARTS FEED APPARATUS

[75] Inventors: Kazuhiro Hineno; Toshio Koike, both of Oizumi, Japan

[73] Assignee: Sanyo Electric Co., Ltd., Osaka, Japan

[21] Appl. No.: 144,237

[22] Filed: Jan. 15, 1988

[30] Foreign Application Priority Data

Jan. 19, 1987 [JP] Japan .................................. 62-9726

[51] Int. Cl.⁵ ........................ B23P 19/04; H05K 13/02
[52] U.S. Cl. ......................................... 221/1; 221/25; 221/211; 414/223
[58] Field of Search ..................... 221/25–29, 221/71, 69, 70, 72, 76, 79, 87, 186, 197, 239, 211, 1; 226/96, 108, 109, 111, 112, 115–117, 120, 8; 242/54 R, 54 A, 55, 67.3 R; 29/825, 829, 842, 759, 740, 741, 743; 414/222, 223

[56] References Cited

U.S. PATENT DOCUMENTS

| | | | |
|---|---|---|---|
| 4,307,832 | 12/1981 | Taki et al. | 29/740 X |
| 4,327,482 | 5/1982 | Araki et al. | 29/759 X |
| 4,389,951 | 6/1983 | Von Hagen | 242/55 X |
| 4,438,559 | 3/1984 | Asai et al. | 29/740 |
| 4,440,355 | 4/1984 | Mori et al. | 226/120 X |
| 4,476,626 | 10/1984 | Gumbert et al. | 29/759 X |
| 4,494,902 | 1/1985 | Kuppens et al. | 221/25 X |
| 4,586,670 | 5/1986 | Vancelette et al. | 242/55 |
| 4,606,117 | 8/1986 | Takahashi et al. | 29/740 |
| 4,610,083 | 9/1986 | Campisi et al. | 29/740 X |
| 4,620,655 | 11/1986 | Fujita | 221/186 X |
| 4,657,158 | 4/1987 | Faes et al. | 221/25 |
| 4,670,976 | 6/1987 | Stridsberg et al. | 29/740 |
| 4,687,152 | 8/1987 | Hawkswell | 242/55 |
| 4,735,341 | 4/1988 | Hamilton et al. | 221/25 X |
| 4,740,136 | 4/1988 | Asai et al. | 29/740 X |
| 4,748,740 | 6/1988 | Buck et al. | 29/740 |

FOREIGN PATENT DOCUMENTS 0218523  2/1985  German Democratic Rep. ... 29/759

Primary Examiner—F. J. Bartuska
Attorney, Agent, or Firm—Darby & Darby

[57] ABSTRACT

A parts feed apparatus comprising a tape feeder which intermittently feeds a tape to a predetermined parts pickup position. A cover tape seals electronic parts at substantially equal intervals along a base tape. The apparatus includes a tape separator which separates the cover tape from the base tape and a parts pickup element which is positioned to block the parts from leaving the parts pickup position as the cover tape is being separated from the base tape. Thus, even when the electronic parts stick to the cover tape during removal, the parts pickup element blocks them from leaving the parts pickup position. The parts pickup element is then used to pick up the electronic parts from the parts pickup position. The tape feeder preferably provides slack to the cover tape before the cover tape is separated.

19 Claims, 16 Drawing Sheets

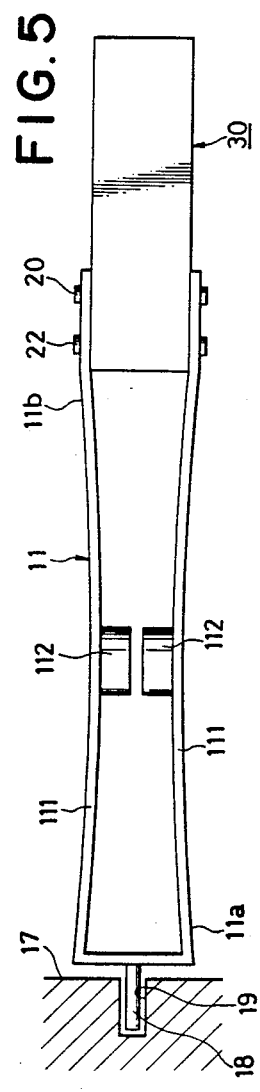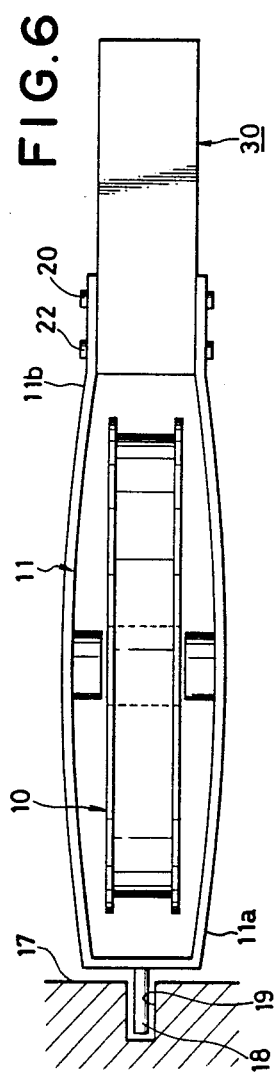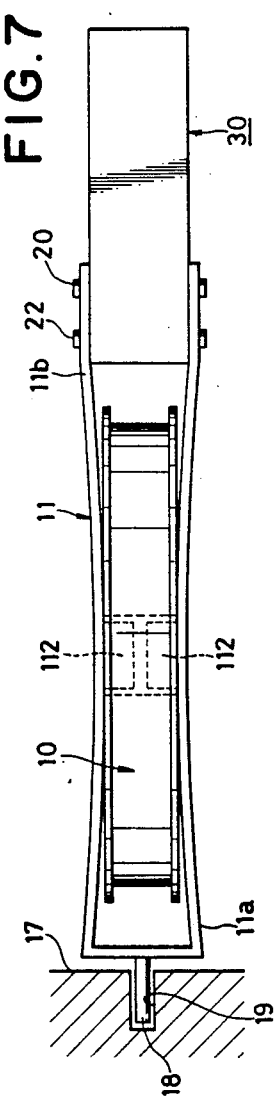

PARTS FEED APPARATUS

BACKGROUND OF THE INVENTION (1) Field of the Invention

The present invention relates to a parts feed apparatus incorporated in an automatic electronic parts mounter or the like and, more particularly, to a parts feed apparatus used to position and mount an electronic chip part (to be referred to as a chip part hereinafter) such as a resistor, capacitor, and a transistor on a printed circuit board (2) Prior Art A conventional parts feed apparatus of an automatic electronic parts mounter of the type described above is disclosed in Japanese Utility Model Disclosure (Kokai) No. 57-148875 filed by the present applicant. In this parts feed apparatus, a tape feed mechanism is linked to a cover tape separating mechanism. Chip parts are sealed in a tape in a sandwich-like manner through a cover tape at equal intervals along the longitudinal direction of the tape. The tape is wound on a tape reel. The tape is intermittently fed from the tape reel and the chip parts are fed to a predetermined parts pickup position However, in such a conventional parts feed apparatus, the cover tape. is separated at a location apart from the parts pickup position prior to pickup of the chip parts.

As a result, in the conventional apparatus, a chip part stored in the tape is dropped or pops to change its posture while it is fed from the cover tape separation position to the parts pickup position, thus easily causing defective parts pickup by a suction unit or the like. Furthermore, since the cover tape separation mechanism is linked to the tape feed mechanism, the tape feed speed cannot be increased too much in order to prevent undesirable movement of the chip part after separation of the cover tape In order to eliminate the above drawbacks, conventionally, a chip parts cover or a shutter is provided to be opened immediately before the parts pickup position. However, since their mechanisms are complex, they do not allow a high-speed operation.

SUMMARY OF THE INVENTION

The present invention has been made to eliminate the drawbacks of the conventional parts feed apparatus incorporated in the automatic electronic parts mounter, and has as its object to provide a parts feed apparatus comprising tape feed means for intermittently feeding a tape to a predetermined parts pickup position, the tape sealing chip parts at substantially equal intervals through a cover tape, cover tape separating means for separating the cover tape of the tape fed by the tape feed means, parts pickup means for picking up a chip part, stored in the tape and exposed when the cover tape is separated by the cover tape separating means, at the predetermined parts pickup position through a vertically movable pickup member, and parts stabilizing means for stabilizing a posture of the part stored in the tape when the part is to be fed. As a result, movement of the chip part after separation of the cover tape can be suppressed, and the speed of the tape feed operation can be increased.

It is another object of the present invention to provide a tape feed apparatus wherein a cover tape separation position by the cover tape separating means is set at the parts pickup position, and the posture of the chip part stored in the tape is stabilized by the pickup member of the parts pickup means when the cover tape is separated. As a result, popping of the chip part stored in the tape can be suppressed when the cover tape is separated from the tape. More specifically, even when the chip part sticks to the cover tape by static electricity or the like upon separation of the cover tape, the chip part is reliably prevented by the pickup member such as a vacuum chuck from dropping, attaching to the cover tape and being carried away with it, or popping undesirably.

It is still another object of the present invention to provide a tape feed apparatus wherein the cover tape separating means comprises an auxiliary separation mechanism for acting on the cover tape which is being separated and thus promoting separation of the cover tape. As a result, the cover tape can be taken up by a constant force, thereby preventing breakage or defective separation of the cover tape.

It is still another object of the present invention to provide a tape feed apparatus wherein the cover (tape which has been separated is taken up through a separation reel which is rotated by an independent external drive system. As a result, the cover tape separation speed can be arbitrarily adjusted and thus allows high speed parts feed operation.

It is still another object to provide a parts feed apparatus which comprises a tape feeder, a slack provider, a cover tape separator and parts pickup means for picking up parts. The tape feeder intermittently feeds a base tape to a predetermined parts pickup position and feeds a cover tape to seal chip-like electronic parts at substantially equal intervals along the base tape. The slack provider provides the cover tape with slack either so as to inhibit the cover tape from being separated from the base tape at the pickup position, or so as to inhibit the chip-like electronic parts from leaving from the base tape even if the cover tape separates before the tape feeder intermittently feeds. The separator separates the cover tape from the base tape at the parts pick-up position. The parts pickup means picks up the exposed electronic part after the separation of the cover tape. This pusher is disposed above the pickup position so as to prevent the electronic part from leaving the parts pickup position as the separator separates the cover tape. The slack provider may be in the form of a pair of swingable levers which sandwich the swing the cover tape after the base tape is fed to facilitate separation of the tape. Afterward, the levers release the cover tape and return to provide the cover tape with slack.

BRIEF DESCRIPTION OF THE DRAWINGS

FIGS. 5 to 7 are plan views, respectively, of the main part of a reel holder holding a tape reel of the same;

DETAILED DESCRIPTION OF THE PREFERRED EMBODIMENT

A preferred embodiment of the parts feed apparatus according to the present invention will be described in detail with reference to the accompanying drawings.

Figure 1:
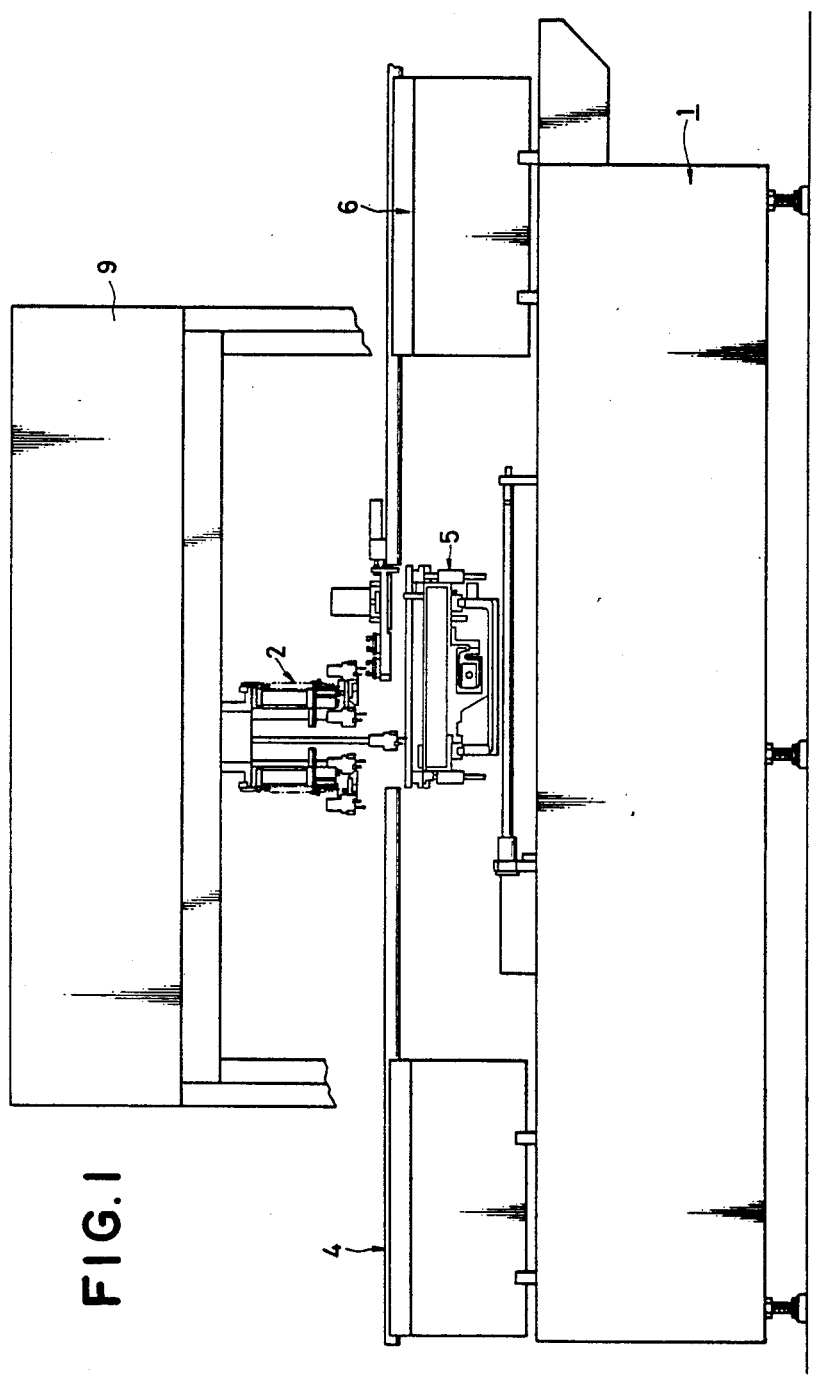
FIG. 1 is a schematic front view showing an overall arrangement of an automatic electronic parts mounter incorporating a parts feed apparatus according to the present invention.
Figure 2:
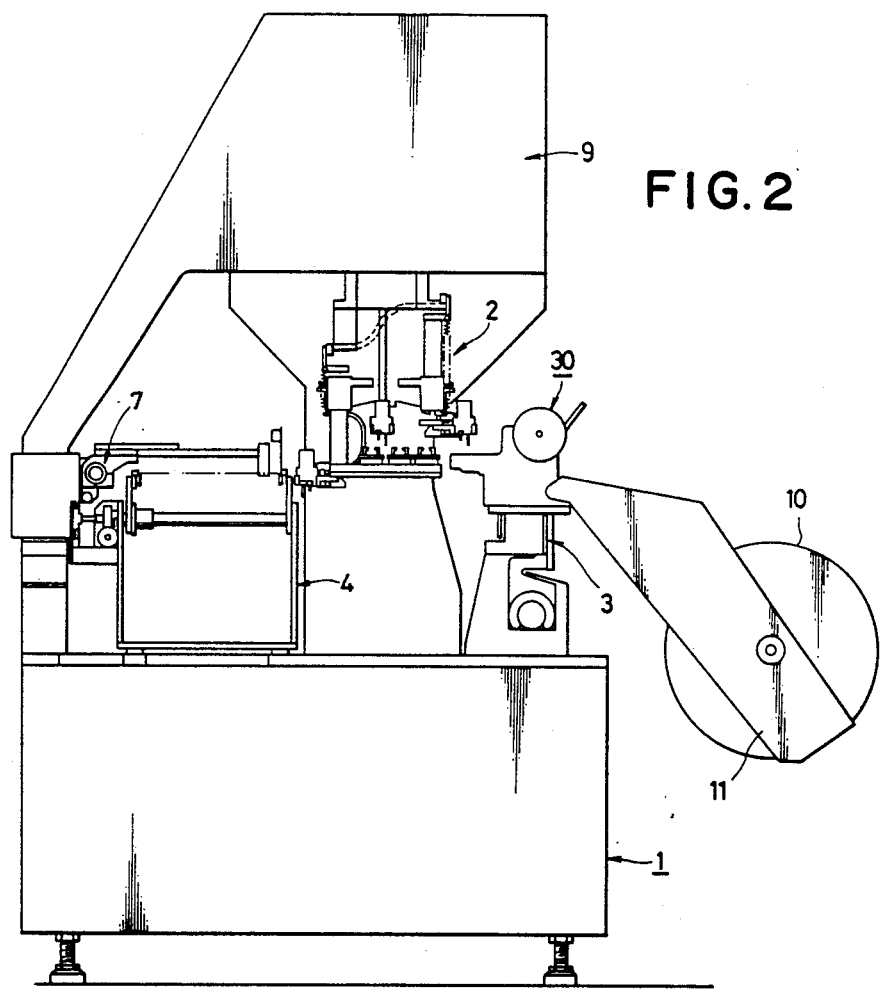
FIG. 2 is a schematic side view.of the same.
Figure 3:
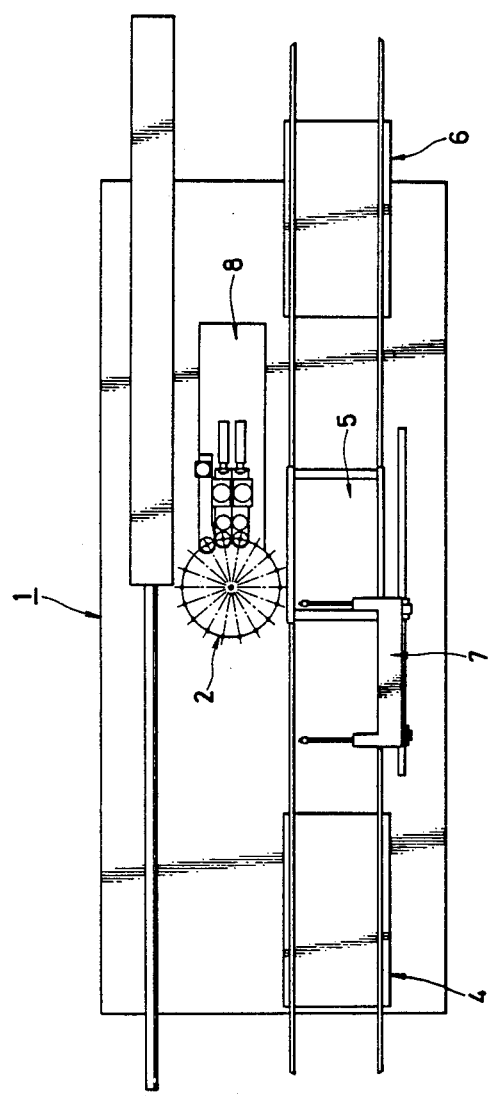
FIG. 3 is a schematic plan view of the same.

FIGS. 1 to 3 schematically show an overall arrangement of the parts feed apparatus according to the present invention. Referring to FIGS. 1 to 3, reference numeral 1 denotes a base table incorporating various types of control systems (not shown). A turntable 2, a parts feed base 3, a first conveyor 4, an X-Y table 5, a second conveyor 6, a convey unit 7, a parts positioning unit 8, an index unit 9, a tape reel 10, and a reel mounting plate 11 are provided on the base table 1. The turntable 2 serves as a 18-divisional parts pickup means. The parts feed base 3 can move in a linear direction, and a plurality of tape feed units 30 to be described later are provided on it. The first conveyor 4 feeds and conveys a printed circuit board (not shown) on which a chip part W (to be described later) is to be mounted. The X-Y table 5 places the printed circuit board supplied from the first conveyor 4 on it and positions and moves it in the X and Y directions. The second conveyor 6 discharges and feeds the chip parts-mounted printed circuit board on the X-Y table 5. The convey unit 7 transfers the printed circuit board on the X-Y table 5 onto the second conveyor 6. The parts positioning unit 8 positions the chip part W on the turntable 2. The index unit 9 is rotated by a servo motor (not shown). The tape reel 10 serves as a tape storing unit to feed a tape 100 (to be described later), sealing chip parts W at substantially equal intervals, to the tape feed unit 30 on the parts feed base 3. The reel mounting plate 11 serves as a reel holding member to hold the tape reel 10 on the movable parts feed base 3. The turntable 2 is provided to the index unit 9 and intermittently rotated by it.

Figure 4:
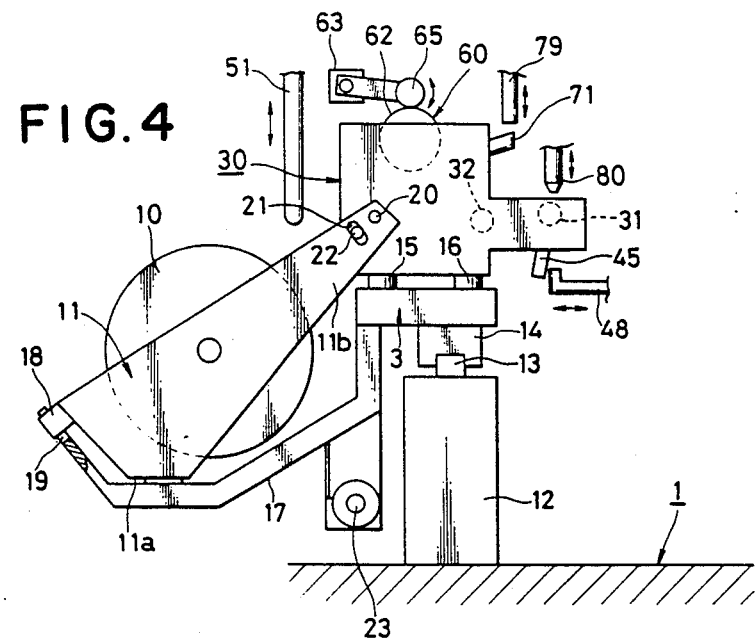
FIG. 4 is a schematic side view of the parts feed apparatus according to the present invention.

The parts feed base 3 is provided on a support base 12 provided on the base table 1 through a linear guide 13 and a linear guide bearing 14 to be linearly movable, as shown in FIG. 4. Support pins 15 and 16 are provided on the parts feed base 3. The tape feed unit 30 is engaged with the support pins 15 and 16 and thus positioned on the parts feed base 3.

Reference numeral 17 denotes a support arm extending from the parts feed base 3. A lower end face 11a of the reel mounting plate 11 for mounting and holding the tape reel is movably supported on the support arm 17. An engaging piece 18 projecting from the lower end side of the reel mounting plate 11 is engaged with a notch 19 formed on the distal end portion of the support arm 17. Therefore, the reel mounting plate 11, i.e., the tape reel 10 is prevented from moving transversely during movement of the parts feed base 3. An upper end portion 11b of the reel mounting plate 11 is mounted on the tape feed unit 30 through a stationary pin 20 and is supported to be vertically swingable about the pin 20. The range of the vertical swinging movement of the upper end portion 11b is regulated by an elongated hole 21 and a guide pin 22 provided therein. Reference numeral 23 denotes a ball screw for moving the parts feed base 3 by a servo motor (not shown).

More specifically, the reel mounting plate 11 for mounting and holding the tape reel 10 is swingable with respect to the tape feed unit 30 such that the weight of the tape reel 10 is supported by the support pins 15 and 16, provided to the parts feed base 3, and the support arm 17. This is for the following reason. The diameter of the tape reel 10 is regulated to be a maximum of 382 mm by the standards of the Electric Industries Association of Japan (EIAJ). When chip parts are fully stored on such a large tape reel, the total weight of the tape reel can exceed 1 kg. In this case, if the reel mounting plate 11 is merely cantilevered on the tape feed unit 30, a considerable mounting strength is required, and it is difficult to provide such a high strength The reel mounting plate 11 comprises a thin plate member 111. As shown in FIG. 5, the two walls of the thin plate member 111 are inwardly curved to have elasticity. As shown in FIG. 6, the two walls of the thin plate member 111 are opened outward and the tape reel 10 is inserted. As shown in FIG. 7, the two side surfaces of the tape reel 10 are elastically clamped between the two walls of the thin plate member 111. Therefore, while the tape reel 10 is reliably held by the elastic clamping force, the load/unload operation of the tape reel 10 is facilitated. The clamping force also serves as a brake to prevent excessive rotation of the tape reel 10 by inertia when the tape is fed from the reel 10. A pair of projections 112 are integrally formed in the inner surfaces of the two walls of the thin plate member 111 The projections 112 are inserted in the central hole of the tape reel 10 and support the tape reel 10 while serving as a center of rotation.

Figure 8:
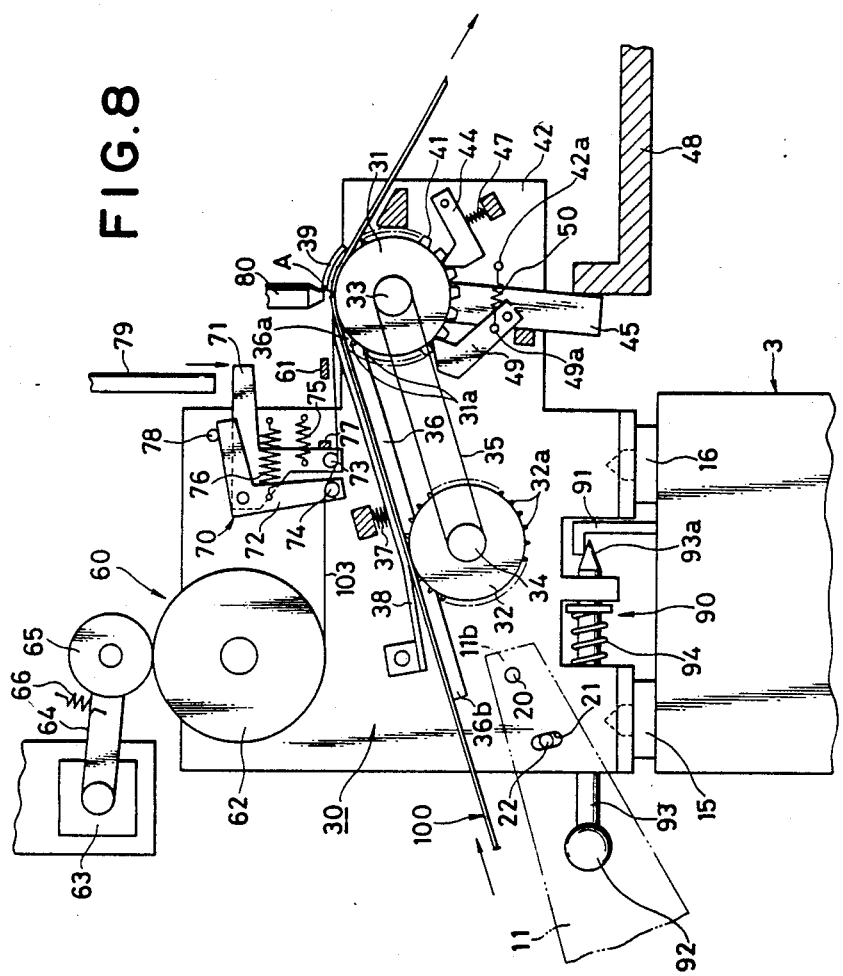
FIG. 8 is a view for schematically showing an internal structure of a tape feed unit of the same.
Figure 9:
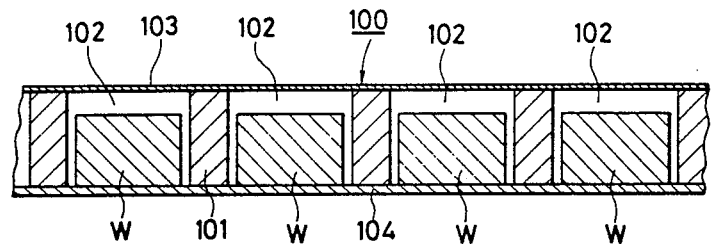
FIG. 9 is a partial enlarged sectional view of a tape which seals chip parts.
Figure 10:
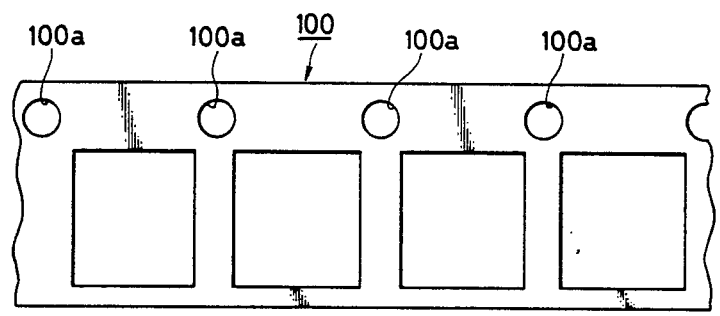
FIG. 10 is a partial enlarged plan view of the tape.

The tape feed unit 30 provided on the parts feed base 3 unwinds the tape 100 wound on the tape reel 10 and feeds it to a suction unit of the turntable 2 as the parts takeup means by a predetermined pitch. The tape feed unit 30 has first and second sprockets 31 and 32, first and second timing pulleys 33 and 34, and a timing belt 35, as shown in FIG. 8. The first sprocket 31 is rotated by a drive system (not shown). The second sprocket 32 is provided to be separated from the first sprocket 31. The first and second timing pulleys 33 and 34 are provided to the first and second sprockets 31 and 32, respectively. The timing belt 35 is looped around the first and second timing pulleys 33 and 34 to rotate them in synchronism with each other. The first and second sprocket 31 and 32 have pins 31a and 32a engageable with feed holes 100a in the tape 100 wound on the tape reel 10 of the parts feed base 3. The first sprocket 31 on the downstream side is located above the second sprocket 32.

A chute 36 is provided between the first and second sprocket 31 and 32. A press plate 38 is provided above the chute 36 and is biased downward by a spring 37. The tape 100 is fed into a space between the chute 36 and the press plate 38. When the first and second timing pulleys 33 and 34 are rotated in synchronism with each other by the timing belt 35, the tape 100 is supplied from the second sprocket 32 side to the first sprocket 31 side obliquely upward. A portion of the tape 100 which has immediately passed the first sprocket 31 is discharged obliquely downward through a tape guide 39. A position immediately above the center of rotation of the first sprocket 31 and corresponding to the top of the supplied tape 100 is defined as a parts pickup position A. Positions of square holes 102 in the tape 100 that are adjacent to the parts pickup position A are set to be lower than the parts pickup position A. As a result, a chip part W can be chucked and picked up by a vacuum chuck 80 of the suction unit serving as a pickup member (to be described later).

Figure 11:
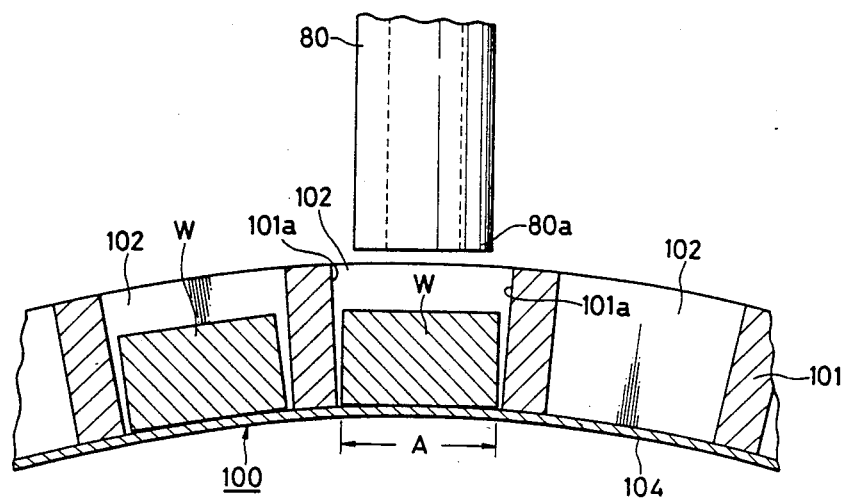
FIGS. 11 and 12 are sectional views, respectively, schematically showing a state wherein a chip part is being picked up at a parts pickup position.
Figure 12:
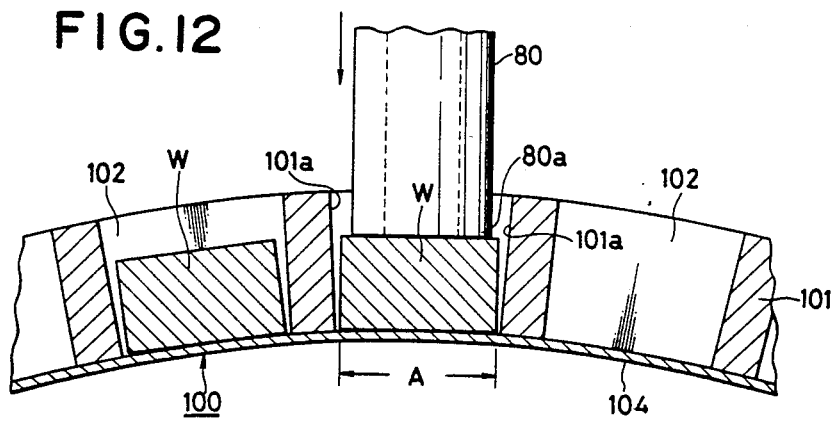

The chip parts W are stored in the square holes 102 formed in a base tape 101 in the longitudinal direction and at a predetermined pitch. The front and rear surfaces of the base tape 101 are covered with cover tapes 103 and 104. As a result, the chip parts W are sealed in the tape 100 at equal intervals in the longitudinal direction. When a chip part W is to be picked up from the tape 100 having such an arrangement, cover tape 103 on the front surface of the base tape 101 is separated by a cover tape separation unit 60 (to be described later) while the tape 100 is being supplied. The corresponding square hole 102 is opened in a recess-like manner, and the chip part W is exposed to the outside. As shown in FIGS. 11 and 12, the parts pickup position A by the vacuum chuck 80 of the suction unit is set at the top of the tape 100 corresponding to a position immediately above the center of rotation of the first sprocket 31. Therefore, when the cover tape 103 is separated from the tape 100 at the parts pickup position A, the tape 100 is bent in an arcuated manner along the outer surface of the circle of the first sprocket 31, and the open recess of the square hole 102 is enlarged. When the chip part W is chucked and held by the downward movement of the vacuum chuck 80 of the suction unit and is picked up by the upward vertical movement of the vacuum chuck 80, it will not be engaged with partition walls 101a defining the hole 102 of the base tape 101, and can be easily and smoothly picked up. As a result, the change in posture of the chip part W during suction and occurrence of defective suction caused by falling of the chip part can be reliably prevented.

Figure 13:
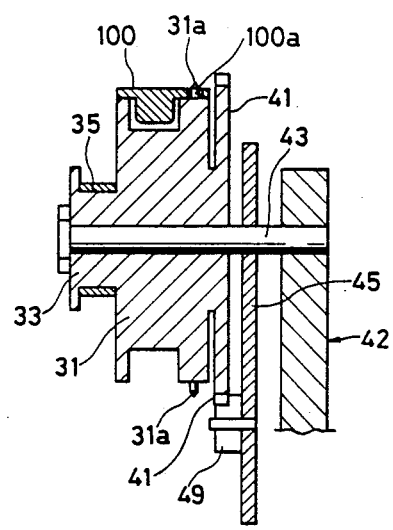
FIG. 13 is a schematic plan view of the main part showing a tape feed portion in a tape feed state.

In FIG. 13, reference numerals 100a denote tape feed holes formed in the tape 100 at a predetermined pitch in the longitudinal direction of the tape 100.

As shown in FIG. 13, a gear 41 is integrally provided with the first sprocket 31 together with the first timing pulley 33. The gear 41 is rotatably supported on the stationary shaft 43 fixed on a stationary frame 42. A swingable arm 45 provided with a swingable gear feed pawl 49 engageable with the gear 41 is swingably supported on the stationary shaft 43. When the swingable arm 45 is swung by the pushing operation of an externally driven first pusher 48 against the biasing force of a spring 47 extending from the stationary frame 42, as shown in FIG. 8, the gear 41 is pivoted in a ratchet manner. As a result, the first sprocket 31 is rotated for one pitch to feed the tape 100 for a distance corresponding to one pitch. More specifically, a spring 50 extends between a pin 49a on the gear feed pawl 49 and a pin 42a on the stationary frame 42. The spring 50 biases the gear feed pawl 49 to be urged against the gear 41, and serves to return the swingable arm 45.

Reference numeral 44 denotes a lock pawl pivotally supported on the stationary frame 42. The lock pawl 44 is elastically engaged with the gear 41 by the biasing force of the spring 47 and prevents reverse rotation of the first sprocket 31 when the swingable arm 45 is returned.

However, assume that the swingable arm 45 is rapidly swung by the externally driven first pusher 48 in order to increase the tape feed speed. When the diameter of the tape reel 10 is large and the inertia is thus large, portions of the tape 100 around the feed holes 100a are sometimes torn.

Figure 14:
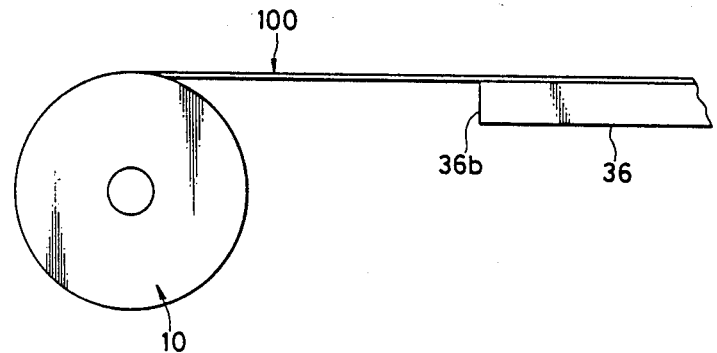
FIGS. 14 and 15 are schematic views, respectively, showing an operational state of a tape pushdown mechanism provided to slack the tape.
Figure 15:
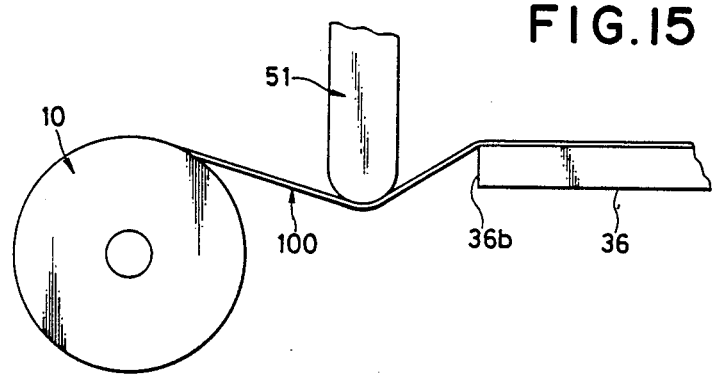

In order to prevent this, according to the present invention, a second pusher 51 serving as a tape pushdown means is provided above an intermediate portion of the tape 100 between the tape reel 10 and a rear end portion 36b of the chute 36, as shown in FIG. 14. When the second pusher 51 is moved downward by an external drive while the tape 100 is not being fed, as shown in FIG. 15, the tape 100 is fed from the tape reel 10 with a margin exceeding a length corresponding to at least a subsequent feed amount of the tape before start of the tape feed operation. The second pusher 51 is then moved upward by an external drive immediately before start of the tape feed operation in order to release the tape pushdown force, thereby slacking the tape 100. As a result, the parts feed apparatus can follow an increase in tape feed speed or in size of the tape reel, and can constantly feed the tape without a necessity to perform a fine brake control of the tape reel.

The cover tape separation unit 60 is used to separate the cover tape 103 of the tape 100 supplied from the parts feed base 3. As shown in FIG. 8, at a position between a stationary guide 61 for regulating an upward curling of the cover tape 103 and the cover tape separation unit 60 in a direction opposite to the tape feed direction, the cover tape separation unit 60 guides a portion of the cover tape 103 separated from the distal end portion 36a of the chute 36 moved to the parts pickup position A side, and takes up the tape 103 on a separation reel 62. When a drive motor 63 provided outside the apparatus is driven, a friction drum 65 is biased by a compression spring 66 through a belt 64 and is rotated. Then, the friction drum 65 is brought into tight contact with the separation reel 62, and the separation reel 62 attains a separating rotational force by an external drive force independent from the drive force of the tape feed mechanism. As a result, the separation speed of the cover tape 103 can be arbitrarily adjusted. Thus, the separation operation allows a high-speed tape feed operation. When the cover tape 103 is tight, the separation reel 62 slips and idles. While the parts feed base 3 moves, the friction drum 65 escapes upwardly to release the tight contact state with the separation reel 62.

A pair of swingable levers 71 and 72 constituting an auxiliary separation mechanism 70 are provided on a path of the cover tape 103 to the separation reel 62. Pins 73 and 74 are provided on the pair of swingable levers 71 and 72 to sandwich the two surfaces of the cover tape 103. Unidirectional rotations of the levers 71 and 72 are allowed by a spring 75 and a stopper 77, and a spring 76 and a stopper 78, respectively. The swingable lever 71 on the upstream side of the separation direction of the cover tape 103 is pivoted clockwise by the pushdown operation of a third pusher 79, moved downward by an external drive, against the biasing force of the spring 75. As a result, the cover tape 103 applied on the tape 100 is forcibly separated.

Figure 16:
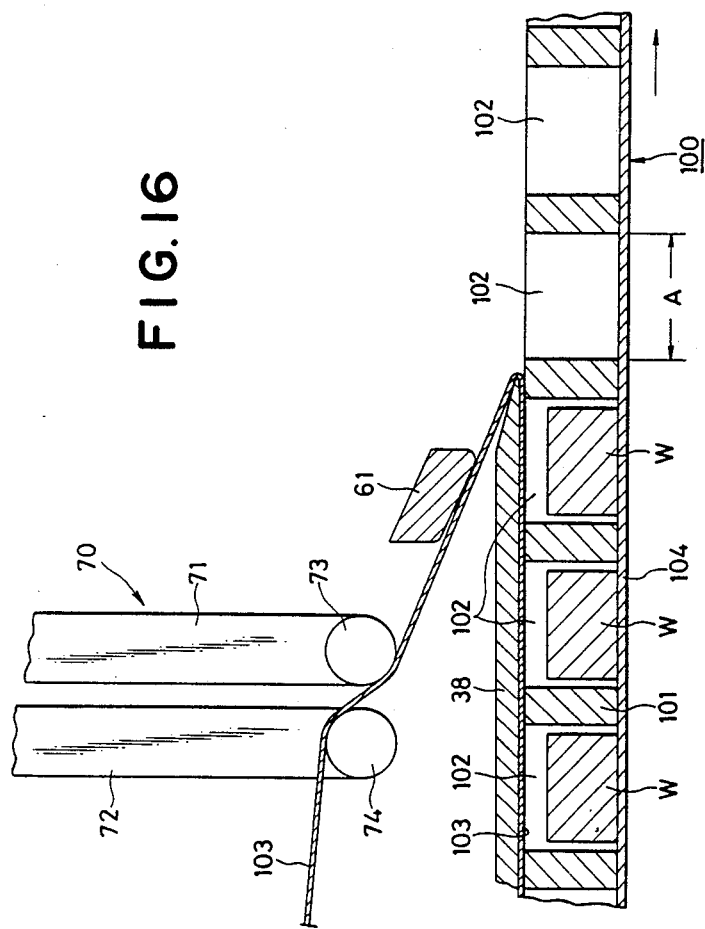
FIGS. 16 to 21 are schematic views, respectively, showing an operational state of a cover tape separating mechanism.
Figure 17:
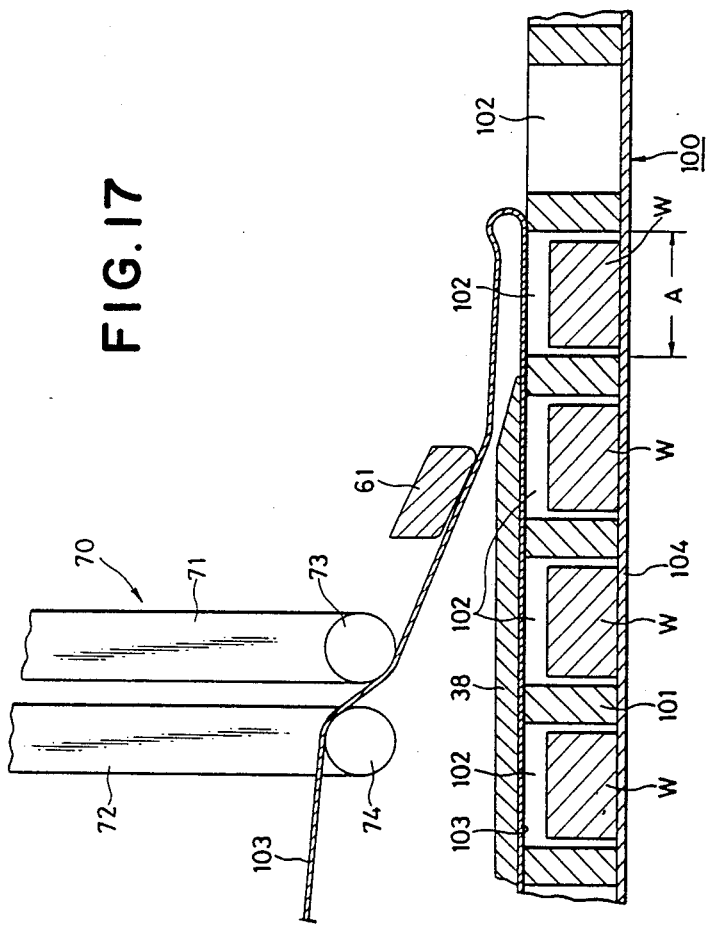

FIGS. 16-21 show explanatory views of the operation of the present invention. The auxiliary separation mechanism 70 is a slack provider in that the cover tape 103 is given slack as shown in FIG. 17 by a swinging movement of swingable levers 71, 72. Slack is provided so as to inhibit either the cover tape 103 from being separated from the base tape 101 at the parts pickup position A or the chip-like electronic parts from leaving the base tape 101 even if the cover tape 103 separates before the tape 100 is intermittently fed.

Figure 18:
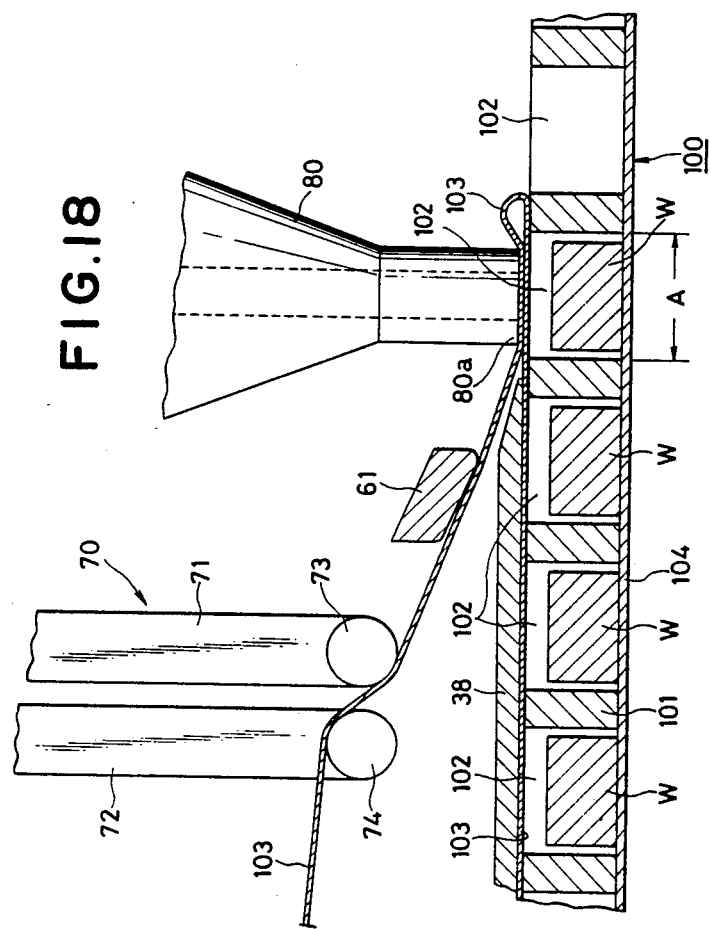
Figure 19:
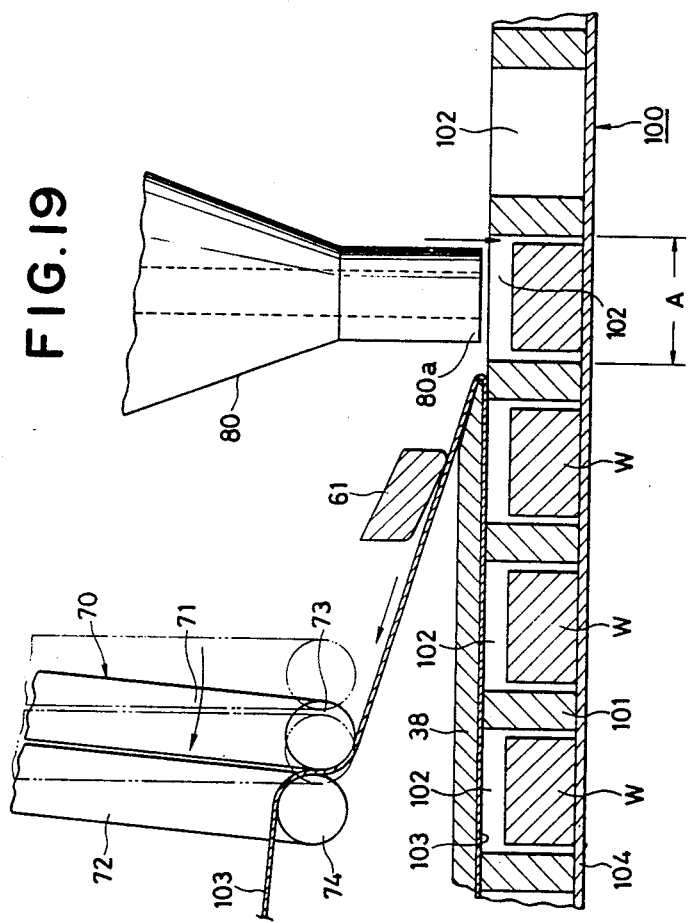

More specifically, with the cover tape separation unit 60 and the auxiliary separation mechanism 70, when the tape 100 is fed for a distance corresponding to one pitch shown in FIG. 17 from the state before start of the feed operation shown in FIG. 16, the cover tape 103 is also fed to the parts pickup position A without being separated. In this state, the vacuum chuck 80 of the suction unit is moved downward, as shown in FIG. 18. A distal end 80a of the vacuum chuck 80 is urged against the cover tape 103 on the tape 100 and then slightly separated from it, and the vacuum chuck 80 is stopped. That is, in this state, the gap between the distal end 80a of the vacuum chuck 80 and the base tape 101 is smaller than the size and shape of the chip part W. Then, as shown in FIG. 19, the third pusher 79 of the auxiliary separation mechanism 70 is externally driven to move downward and pivots the swingable lever 71 clockwise. The pin 73 is abutted against the pin 74 of the other swingable lever 72 and the cover tape 103 is sandwiched by the pins 73 and 74. Simultaneously, the other swingable lever 72 is pivoted clockwise, and the cover tape 103 is pulled and separated from the base tape 101 of the tape 100. The square hole 102 to the base tape 101 is opened and the chip part W stored in the tape is exposed.

By this operation, the separation position of the cover tape 103 from the base tape 101 is moved to the end of the press plate 38. That is, the end of the press plate 38 serves as a separation fulcrum for separating the cover tape 103.

In this case, the distal end 80a of the vacuum chuck 80 is closely located above the square hole 102 of the opened base tape 101. Therefore, even when the chip part W sticks to the rear surface of the cover tape 103 with static electricity or the like, it is stripped off with the distal end 80a of the vacuum chuck 80 upon separation of the cover tape 103 and is left in the square hole 102.

Figure 20:
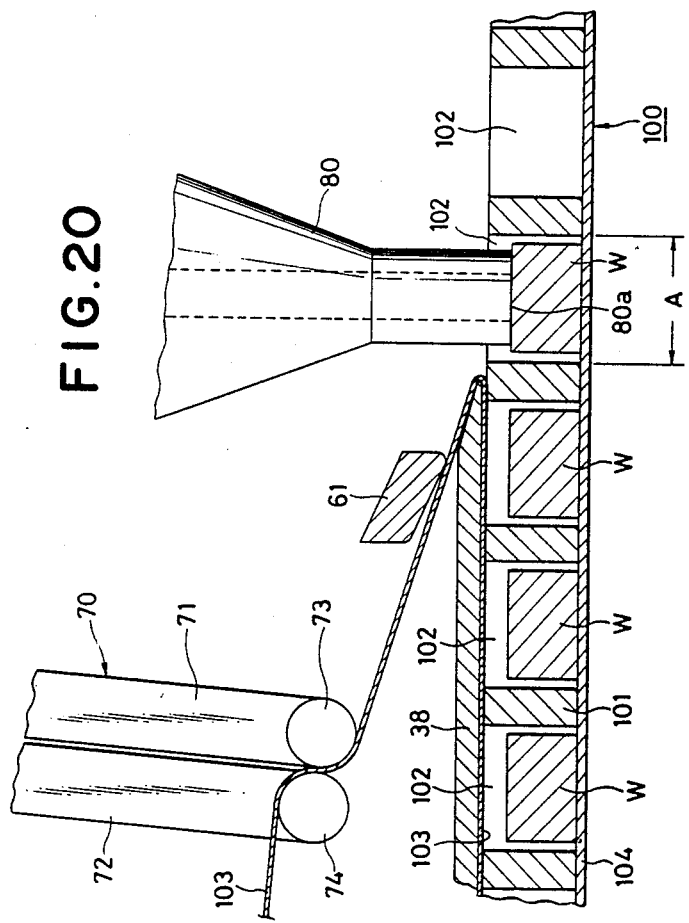
Figure 21:
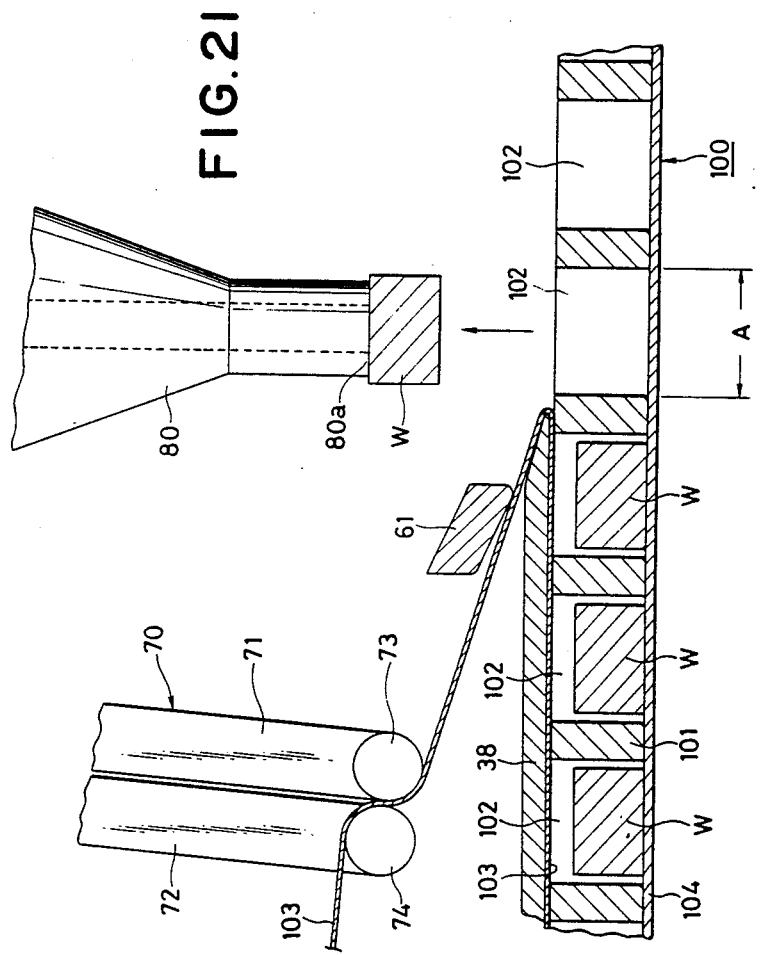

When the cover tape 103 is separated for the tape 100 in this manner, the vacuum chuck 80 is moved downward again, as shown in FIG. 20, and chucks the chip part W in the square hole 102 of the tape 100 with its distal end 80a. When the vacuum chuck 80 is moved upward in the vertical direction, as shown in FIG. 21, the chip part W is picked up. When the turntable 2 is rotated, the picked chip part W is placed on a printed circuit board (not shown) which is positioned on the X-Y table 5 and mounted on it.

The distal end 36a of the chute 36 is set at a position to achieve the following positional relationship. Namely, the position for separating the cover tape 103 of the tape 100 with the cover tape separation unit 60 and the auxiliary separation mechanism 70 is immediately before the parts pickup position A which is immediately above the center of rotation of the first sprocket 31. Therefore, the cover tape 103 of the tape 100 can be fed to the parts pickup position A without being separated. The cover tape 103 is separated at a position where the distal end 80a of the vacuum chuck 80 of the suction unit is closest to it. As a result, with the distal end 80a of the vacuum chuck 80, the chip part W exposed when the cover tape 103 is separated is prevented from dropping from the tape 100, being attached to the cover tape 103 and carried away, or popping undesirably.

Referring to FIG. 8, reference numeral 90 denotes a lock mechanism for locking the tape feed unit 30 on the parts feed base 3. A lock pin 93 of the lock mechanism 90 has a handle 92 at its one end. A tapered distal end 93a of the lock pin 93 is inserted in an L-shaped lock metal member 91, mounted on the parts feed base 3, in a wedge-like manner against the biasing force of a spring 94. This wedge effect is utilized to detachably lock the tape feed unit 30 on the parts feed base 3.

Figure 22:
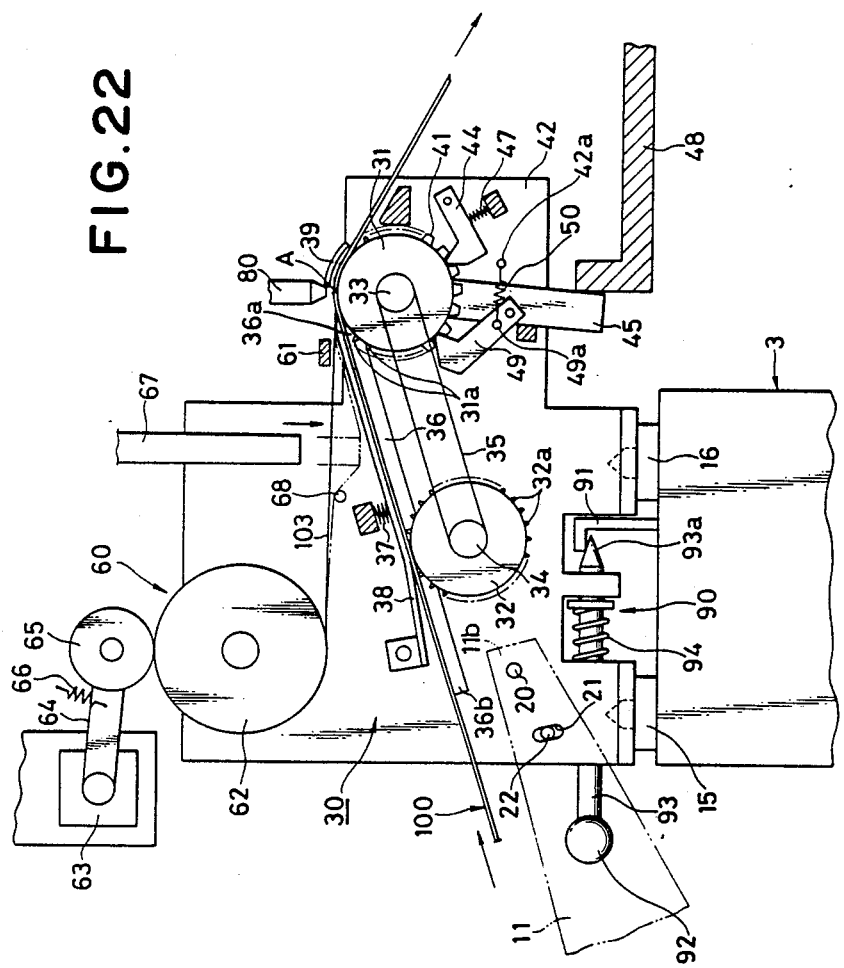
FIG. 22 is a schematic view of another embodiment of a cover tape separating mechanism of the present invention.

In the above embodiment, the auxiliary separation mechanism 70 is provided along the path to separate the cover tape 103. However, the present invention is not limited to this. In FIG. 22, according to another embodiment of the present invention, the auxiliary separation mechanism 70 is eliminated and the drive of the separating reel 62 of the cover tape separation unit 60 is appropriately controlled to sufficiently provide the operation and effect of the present invention. In this case, if a tension is applied to the cover tape 103, the cover tape 103 may be undesirably separated in the subsequent tape feed operation. In order to prevent this, the cover tape 103 is urged by a fourth pusher 67, moved downward upon reception of an external drive force, at an upstream position of a pin 68, and is slacked, as shown in FIG. 22.

As another means for slacking the cover tape 103, the separating reel 62 can be used if it is rotated in the opposite direction.

Various changes and modifications can be made within the spirit and scope of the invention.

What is claimed is:

1. A parts feed apparatus, comprising:
tape feed means for intermittently feeding a tape to a predetermined parts pickup position, said tape including a base tape and a cover tape, said cover tape sealing chip-like electronic parts at substantially equal intervals in a base tape;
separating means for separating said cover tape from said base tape at said parts pickup position;
parts pickup means for picking up said electronic parts after said separating means separates said cover tape from said base tape and for preventing said electronic parts from leaving said parts pickup position as said separating means separates said cover tape from said base tape; and
means for disposing said parts pickup means closely over said parts pickup position as said separating means separates said cover tape from said base tape so that even when the electronic parts stick to said cover tape, said parts pickup means blocks said electronic parts from leaving said parts pickup position.

2. A method for feeding parts, comprising:
intermittently feeding a tape that has a base tape and a cover tape, the cover tape sealing chip-like electronic parts at substantially equal intervals in the base tape;
separating the cover tape from the base tape at the parts pickup position;
picking up the electronic parts with a parts pickup element after the step of separating; and
positioning the parts pickup element closely over the parts pickup position during the step of separating so that even when the electronic parts stick to said cover tape, said parts pickup means block the electronic parts from leaving the parts pickup position.

3. A parts feed apparatus, comprising:
tape feed means for intermittently feeding a tape to a predetermined parts pickup position, said tape including a base tape and a cover tape, said cover tape sealing chip-like electronic parts at substantially equal intervals in said base tape;
separating means for separating said cover tape from said base tape at said parts pickup position;
parts pickup means for picking up said electronic parts after said separating means separates said cover tape from said base tape and for preventing said electronic parts from leaving said parts pickup position as said separating means separates said cover tape from aid base tape; and
slack providing means for providing said cover tape with slack prior to said tape feed means intermittently feeding said base tape, said parts pickup means being arranged relative to said cover tape so as to inhibit either said cover tape from becoming separated from said base tape at said parts pickup position or the chip-like electronic parts from leaving said base tape even if said cover tape separates before said tape feeder intermittently feeds, said parts pickup means including means for pressing a folded portion of said cover tape created by said slack providing means, said parts pickup means picking up the electronic parts which become exposed immediately after said separating means separates said cover tape from said base tape.

4. A parts feed apparatus according to claim 3, further comprising:
slack providing means for providing said cover tape with slack prior to said tape feed means intermittently feeding said base tape so as to inhibit either said cover tape from becoming separated from said base tape at said parts pickup position or the chip-like electronic parts from leaving said base tape even if said cover tape separates before said tape feeder intermittently feeds.

5. A parts feed apparatus according to claim 4, wherein said parts pickup means includes means for pressing a folded portion of said cover tape created by said slack providing means, said parts pickup means picking up the electronic parts which become exposed immediately after said separating means separates said cover tape from said base tape.

6. A parts feed apparatus according to claim 3, wherein said separating means includes a separation fulcrum disposed by said parts pickup position.

7. A parts feed apparatus according to claim 3, further comprising:
means for bringing said parts pickup means closer to said base tape, said separating means effecting a separation of said cover tape from said base tape in response to said bringing means so as to cause a gap between said parts pickup means and said base tape to become smaller than a thickness of the electronic part to be picked up next.

8. A parts feed apparatus according to claim 4, wherein said slack providing means includes swingable levers which sandwich and swing a sandwiched portion of said cover tape after said base tape is fed by said tape feed means so as to separate another portion of said cover tape from said base tape, said levers releasing said sandwiched cover tape thereafter and returning so as to provide said slack.

9. A parts feed apparatus according to claim 8, which said levers return to provide said cover tape with said slack corresponding to one pitch feed.

10. A parts feed apparatus according to claim 4, wherein said slack providing means is composed of an upward and downward movable pusher which presses said cover tape downward before said tape is fed by said tape feed means, in order to provide said cover tape with said slack, upwardly moves to release the cover tape from being pressed when said base tape is fed by said tape feed means and presses said cover tape while said cover tape is separated by said separating means.

11. A parts feed apparatus according to claim 3, further comprising:
means for taking up said cover tape after separation from said parts pickup position, said taking up means including a separation reel; and
means for rotating said separation reel.

12. A method for feeding parts, comprising:
intermittently feeding a tape that has a base tape and a cover tape, the cover tape sealing chip-like electronic parts at substantially equal intervals in the base tape;
separating the cover tape from the base tape at the parts pickup position;
picking up the electronic parts with a parts pickup element after the step of separating;
positioning the parts pickup element closer to the cover tape so as to prevent the electronic parts from leaving the parts pickup position during the step of separating;
slacking the cover tape prior to the step of intermittently feeding so as to inhibit either the cover tape from separating from the base tape or the chip-like electronic parts from leaving the base tape even if the cover tape separates before the step of intermittently feeding takes place, the step of slacking producing a folded portion of the cover tape; and
pressing the folded portion of the cover tape with the parts pickup element, the step of picking up including immediately picking up the electronic part which is exposed after the step of separating.

13. A method according to claim 12, further comprising:
slacking the cover tape prior to the step of intermittently feeding so as to inhibit either the cover tape from separating from the base tape or the chip-like electronic parts from leaving the base tape even if the cover tape separates before the step of intermittently feeding takes place.

14. A method according to claim 12, wherein the step of slacking produces a folded portion of the cover tape, further comprising the step of:
pressing the folded portion of the cover tape with the parts pickup element, the step of picking up including immediately picking up the electronic part which is exposed after the step of separating.

15. A method according to claim 12, further comprising the step of:
bringing the base tape so that the gap therebetween becomes smaller than a thickness of the electronic part to be picked up next, the step of separating taking place after the step of bringing closer together.

16. A method according to claim 13, wherein the step of slacking includes sandwiching a portion of the cover tape which is separated from the base tape and swinging the portion of the sandwiched cover tape after the step of intermittently feeding in order to separate another portion of the cover tape from the base tape, and afterward releasing the cover tape to provide the cover tape with the slack.

17. A method according to claim 16. wherein the step of slacking includes slacking by one pitch feed.

18. A method according to claim 12, wherein the step of picking up the electronic parts includes reciprocating a pusher to press the cover tape downward before the step of intermittently feeding so as to provide the cover tape with slack, the step of picking up also including moving the pusher downward to release the cover tape from being pressed during the step of intermittently feeding, the step of picking up also including pressing the cover tape with the pusher during the step of separating.

19. A method according to claim 12, further comprising the step of taking up the cover tape after the step of separating.

* * * * *